(12) United States Patent
Tsang et al.

(10) Patent No.: US 6,977,838 B1
(45) Date of Patent: Dec. 20, 2005

(54) METHOD AND SYSTEM FOR PROVIDING A PROGRAMMABLE CURRENT SOURCE FOR A MAGNETIC MEMORY

(75) Inventors: David Tsang, Cupertino, CA (US); Xizeng Shi, Fremont, CA (US); Po-Kang Wang, San Jose, CA (US); Hsu Kai (Karl) Yang, Pleasanton, CA (US); David Hu, Los Altos, CA (US)

(73) Assignees: Applied Spintronics Technology, Inc., Milpitas, CA (US); Headway Technologies, Milpitas, CA (US)

( * ) Notice: Subject to any disclaimer, the term of this patent is extended or adjusted under 35 U.S.C. 154(b) by 16 days.

(21) Appl. No.: 10/781,482

(22) Filed: Feb. 17, 2004

Related U.S. Application Data (60) Provisional application No. 60/494,003, filed on Aug. 11, 2003.

(51) Int. Cl.[7] .............................................. G11C 11/00
(52) U.S. Cl. ...................................... 365/158; 365/191
(58) Field of Search ................................ 365/158, 191

(56) References Cited

U.S. PATENT DOCUMENTS

| | | | | |
|---|---|---|---|---|
| 5,946,227 A | * | 8/1999 | Naji | 365/158 |
| 6,055,178 A | * | 4/2000 | Naji | 365/158 |
| 6,404,671 B1 | * | 6/2002 | Reohr et al. | 365/158 |
| 6,452,823 B1 | * | 9/2002 | Naji | 365/50 |
| 6,577,549 B1 | * | 6/2003 | Tran et al. | 365/211 |
| 6,778,429 B1 | * | 8/2004 | Lu et al. | 365/158 |

* cited by examiner

*Primary Examiner*—M. Tran
(74) *Attorney, Agent, or Firm*—Sawyer Law Group LLP (57) ABSTRACT

A method and system for providing a magnetic memory are disclosed. The method and system include providing a plurality of magnetic memory cells and at least one programmable current source. Each of the plurality of magnetic memory cells includes a first magnetic element. The programmable current source(s) are for programming a portion of the plurality of magnetic memory cells. Each of the programmable current source(s) includes a controller and a current source coupled to the controller. The controller is for determining a current provided by the current source and includes at least a second magnetic element. The second magnetic element(s) are substantially the same as the first magnetic element. The controller determines the current provided by the current source based on the at least the second magnetic element.

17 Claims, 8 Drawing Sheets

METHOD AND SYSTEM FOR PROVIDING A PROGRAMMABLE CURRENT SOURCE FOR A MAGNETIC MEMORY

CROSS-REFERENCE TO RELATED APPLICATIONS

This application is claiming under 35 USC 119(e) the benefit of provisional patent application Ser. No. 60/494,003 filed on Aug. 11, 2003.

FIELD OF THE INVENTION

The present invention pertains to reading nonvolatile magnetic memories, such as a magnetic random access memory (MRAM), and more particularly to a method and system for providing a more reliable magnetic element that is less subject to variations due to processing.

BACKGROUND OF THE INVENTION

DRAM, FLASH, and SRAM are the three major conventional semiconductor memories on the market. The manufacturing cost of DRAM is the lowest. However, in addition to shortcomings such as the need for refreshment, relatively low speed and high power consumption, DRAM is volatile. Consequently, a DRAM loses data when the power is turned off. FLASH memory is non-volatility, but is very slow. The write cycle endurance for a FLASH memory is less than one million cycles. This write cycle endurance limits the application of FLASH memories in some high data rate market. SRAM is a fast memory. However, SRAM is volatile and takes too much silicon area per cell. In search of a universal random access memory that offers high speed, non-volatility, small cell area, and good endurance, many companies are developing thin film Magnetic Random Access Memories (MRAM).

Conventional MRAMs can be fabricated with a memory cells using a variety of magnetic elements, such as an Anisotropic Magnetoresistance (AMR) element, a Giant Magnetoresistance (GMR) element, and a Magnetic Tunneling Junction (MTJ) stack. For example, a conventional MTJ stack is relatively simple to manufacture and use. Consequently, an MRAM utilizing a conventional MTJ stack in the magnetic cell is used as the primary example herein.

The magnetic field for changing the orientation of the changeable magnetic vector is usually supplied by two conductive lines that are substantially orthogonal to each other. When electrical current passes through the two conductive lines at the same time, two magnetic fields associated with the current in the two conductive lines act on the changeable magnetic vector to orient its direction.

Figure 1:
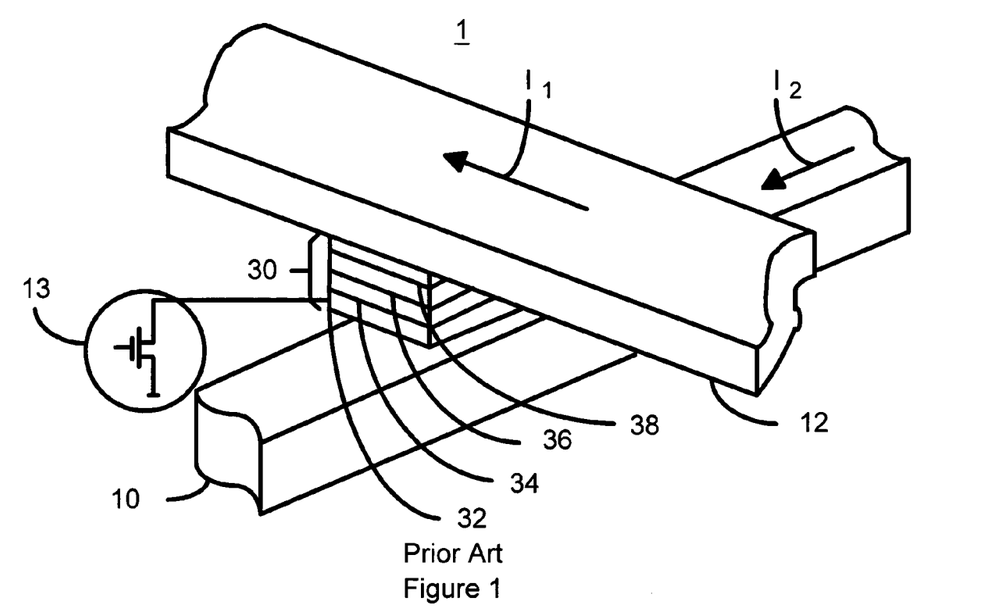
FIG. 1 is a three-dimensional view of a portion of a conventional magnetic memory including a MTJ cell, located at the intersection of a bit line and a word line.

FIG. 1 depicts a portion of a conventional MRAM 1. The conventional MRAM includes conventional orthogonal conductive lines 10 and 12, conventional magnetic storage cell having a conventional MTJ stack 30 and a conventional transistor 13. In some designs, the conventional transistor 13 is replaced by a diode, or completely omitted, with the conventional MTJ cell 30 in direct contact with the conventional word line 10. The conventional MRAM 1 utilizes a conventional magnetic tunneling junction (MTJ) stack 30 in a memory cell. Use of a conventional MTJ stack 30 makes it possible to design an MRAM cell with high integration density, high speed, low read power, and soft error rate (SER) immunity. The conductive lines 10 and 12 are used for writing data into the magnetic storage device 30. The MTJ stack 30 is located on the intersection of and between conventional conductive lines 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 30 stack primarily includes the free layer 38 with a changeable magnetic vector (not explicitly shown), the pinned layer 34 with a fixed magnetic vector (not explicitly shown), and an insulator 36 in between the two magnetic layers 34 and 38. The insulator 36 typically has a thickness that is low enough to allow tunneling of charge carriers between the magnetic layers 34 and 38. Thus, the insulator 36 typically acts as a tunneling barrier between the magnetic layers 34 and 38. Layer 32 is usually a composite of seed layers and an antiferromagnetic (AFM) layer that is strongly coupled to the pinned magnetic layer. The AFM layer included in the layers 32 is typically a Mn alloy, such as IrMn, NiMn, PdMn, PtMn, CrPtMn, and so on. The AFM layer is typically strongly exchanged coupled to the pinned layer 34 to ensure that the magnetic vector of the pinned layer 34 is strongly pinned in a particular direction.

When the magnetic vector of the free layer 38 is aligned with that of the pinned layer 34, the MTJ stack 30 is in a low resistance state. When the magnetic vector of the free layer 38 is antiparallel to that of the pinned layer 34, the MTJ stack 30 is in a high resistance state. Thus, the resistance of the MTJ stack 30 measured across the insulating layer 34 is lower when the magnetic vectors of the layers 34 and 38 are parallel than when the magnetic vectors of the layers 34 and 38 are in opposite directions.

Data is stored in the conventional MTJ stack 30 by applying a magnetic field to the conventional MTJ stack 30. The applied magnetic field has a direction chosen to move the changeable magnetic vector of the free layer 30 to a selected orientation. During writing, the electrical current $I_1$ flowing in the conventional bit line 12 and $I_2$ flowing in the conventional word line 10 yield two magnetic fields on the free layer 38. In response to the magnetic fields generated by the currents $I_1$ and $I_2$, the magnetic vector in free layer 38 is oriented in a particular, stable direction. This direction depends on the direction and amplitude of $I_1$ and $I_2$ and the properties and shape of the free layer 38. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Although the conventional MRAM 1 functions, one of ordinary skill in the art will readily recognize that the conventional MRAM 1 is subject to malfunctions. The field and, therefore, the current required to write to the conventional MTJ stack 30 depends upon a variety of factors. In particular, the amplitude of the magnetic field required to switch the direction of the changeable magnetic vector in free layer 38, and thus the switching current, depend upon the properties of the conventional MTJ stack 30 such as the thickness of the films 32, 34, 36, and 38 of the conventional MTJ stack 30, the crystalline structure of the magnetic films 34 and 38. These properties are process dependent and process tool dependent. Because of unavoidable variations in processing and variations in uniformity from wafer to wafer and across any single wafer, different conventional MTJ stacks 30 may require a different programming current to be written to (have the magnetizations of the free layers 38 oriented in the desired direction). If different programming currents are not provided, the conventional MTJ stack 30 may not be written or adjacent conventional MTJ stacks (not shown) may be inadvertently written. Furthermore, the switching field and, therefore, the current required to switch the direction of the magnetic vector for the conventional free layer 38 may be temperature dependent. In particular, a larger current is required at lower temperatures. Consequently, the performance the conventional magnetic memory 1 employing the conventional MTJ stack 30 may be compromised.

Accordingly, what is needed is a method and system for providing a magnetic memory capable of having improved reliability and performance.

SUMMARY OF THE INVENTION

The present invention provides a method and system for providing a magnetic memory. The method and system comprise providing a plurality of magnetic memory cells and at least one programmable current source. Each of the plurality of magnetic memory cells includes a first magnetic element. The programmable current source(s) are for programming a portion of the plurality of magnetic memory cells. Each of the programmable current source(s) includes a controller and a current source coupled to the controller. The controller is for determining a current provided by the current source and includes at least a second magnetic element. The second magnetic element(s) are substantially the same as the first magnetic element. The current provided by the current source is determined based on the at least the second magnetic element.

According to the system and method disclosed herein, the present invention provides a method for providing a magnetic memory element that has improved performance and reliability.

DETAILED DESCRIPTION OF THE INVENTION

The present invention provides a method and system for reading a magnetic memory including a plurality of magnetic elements. The method and system comprise determining a first resistance of at least one of the plurality of magnetic elements. The method and system also comprise applying a disturb magnetic field to the at least one of the plurality of magnetic elements and determining a second resistance of the at least one of the plurality of magnetic elements while the disturb magnetic field is applied. The method and system further comprise comparing the first resistance to the second resistance.

The present invention provides a method and system for providing a magnetic memory. The method and system comprise providing a plurality of magnetic memory cells and at least one programmable current source. Each of the plurality of magnetic memory cells includes a first magnetic element. The programmable current source(s) are for programming a portion of the plurality of magnetic memory cells. Each of the programmable current source(s) includes a controller and a current source coupled to the controller. The controller is for determining a current provided by the current source and includes at least a second magnetic element. The second magnetic element(s) are substantially the same as the first magnetic element. The controller determines a current provided by the current source based on the at least the second magnetic element.

The present invention will be described in terms of particular types of magnetic memory elements, particular materials, and a particular configuration of elements. For example, the present invention will be described in the context of illustrative magnetic random access memory (MRAM) cells. One of ordinary skill in the art will, however, recognize that the present invention is not limited to any particular magnetic memory devices. Thus, one of ordinary skill in the art will readily realize that this method and system will operate effectively for other magnetic memory cells, and other materials and configurations non inconsistent with the present invention. Instead, the present invention is applicable to other magnetic memory devices. The present invention is also described in the context of magnetic tunneling junction (MTJ) stacks. However, one of ordinary skill in the art will readily recognize that the present invention is not limited to such devices. Instead other devices not inconsistent with the present invention, for example spin-valve or other GMR magnetic elements or AMR elements, may also be used. One of ordinary skill in the art will also realize that alternate magnetic elements might be used with or without modification to the portions of the architecture described herein. In addition, the present invention is described in the context of a single magnetic element per magnetic memory cell. However, one of ordinary skill in the art will readily recognize that multiple elements may be used.

Figure 2:
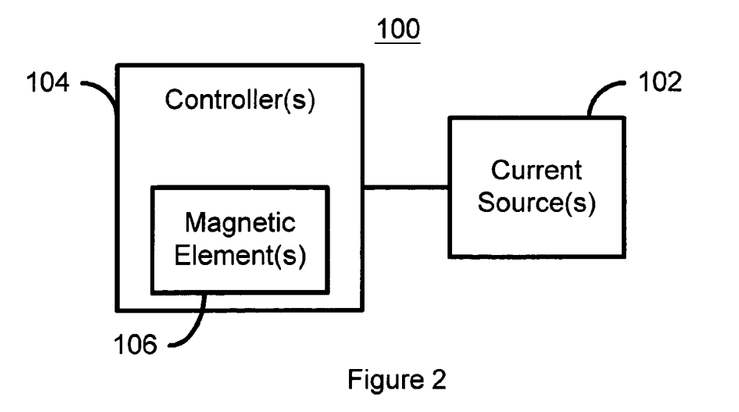
FIG. 2 is a high-level diagram depicting one embodiment of a programmable current source in accordance with the present invention.

To more particularly illustrate the method and system in accordance with the present invention, refer now to FIG. 2, a high-level diagram depicting one embodiment of a programmable current source 100 in accordance with the present invention. The programmable current source 100 is used to provide current for programming some portion (including all) of the memory cells (not shown) in a magnetic memory. The current source 100 is thus used in programming magnetic elements within the magnetic memory cells. In a preferred embodiment, the programmable current source 100 is used in programming MTJ stacks, such as the MTJ stack 30 depicted in FIG. 1. Referring to FIGS. 1 and 2, for example, the programmable current source 100 might be used in providing $I_1$ and/or $I_2$, discussed above. The programmable current source 100 preferably provides a current to fewer than all of the magnetic elements in the magnetic memory. For example, the magnetic memory might be partitioned into an array of banks of memory cells. In such an embodiment, each bank may correspond to and be written by a particular programmable current source 100.

The programmable current source 100 includes at least one current source 102 and at least one controller 104. The current source(s) 102 generate and output the current(s) used in programming the magnetic elements in the storage cells, for example the MTJ stacks 30. The controller(s) 104 controls the current provided by the current source(s) 102. In a preferred embodiment, the controller(s) 104 controls the amplitude of the current provided by the current source(s) 102. Each of the controller(s) 104 includes at least one magnetic element 106. The magnetic element(s) 106 in the controller(s) 104 are preferably substantially the same as the magnetic elements being programmed. The magnetic element(s) 106 in the controller(s) are used by the controller(s) 104 to determine the appropriate control signal(s) to provide to the current source(s) 102 and, therefore, to determine the current output by the current source(s) 102. Thus, the controller(s) 104 determine the current(s) provided by the current source(s) 102 based upon the magnetic element(s) 106. In a preferred embodiment, the magnetic element(s) 106 in the controller(s) 104 are MTJ stacks, such as the MTJ stack 30. In an alternate embodiment, the magnetic element(s) 106 could be other structures, for example a spin valve or other GMR structure or an AMR element.

Thus, the magnetic element(s) 106 in the controller 104 can be used to ensure that the current provided by the programmable current source 100 takes into account many of the issues described above, particularly if the programmable current source 100 is used for sections of the magnetic memory. The same processes and tools used in forming the magnetic elements, such as the MTJ stacks 30, are preferably used in forming the magnetic element(s) 106. Consequently, through the use of the magnetic element(s) 106, the controller(s) 104 can account for nonuniformities and other issues in the magnetic elements used for data storage. As a result, the current source(s) 102 provide the appropriate current for programming the corresponding magnetic elements used for data storage. For example, using the magnetic element(s) 106, one or more of the controller(s) 104 could control one or more of the current source(s) to output a current having a value based at least in part upon the switching characteristic of the magnetic element(s) 106 or the resistance of the magnetic element(s) 106. Thus, the currents used to program the magnetic elements that store data can be controlled based at least in part upon the switching characteristic of the magnetic element or the resistance of the magnetic element.

Figure 3A:
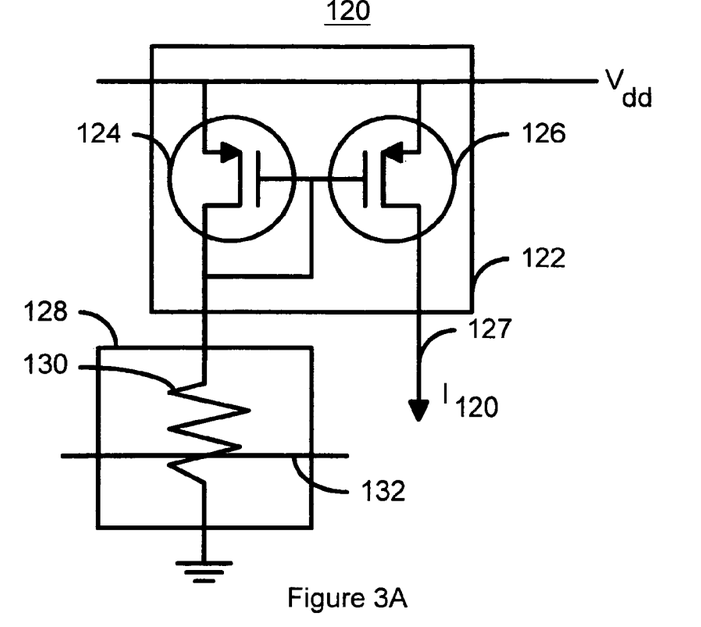
FIG. 3A is a more detailed diagram of a first embodiment of a programmable current source in accordance with the present invention.

FIG. 3A depicts a more detailed diagram of a first embodiment of a programmable current source 120 in accordance with the present invention. The programmable current source 120 is thus used in programming magnetic elements within the magnetic memory cells. In a preferred embodiment, the programmable current source 120 is used in programming MTJ stacks, such as the MTJ stack 30 depicted in FIG. 1. Referring to FIGS. 1 and 3A, for example, the programmable current source 120 might be used in providing $I_1$ and/or $I_2$, discussed above. Also in a preferred embodiment, the programmable current source 120 provides a current to a portion of the magnetic elements in the magnetic memory. For example, the magnetic memory might be divided into banks, each of which corresponds to and is written by a particular programmable current source 120.

The programmable current source 120 includes a current source 122 and a controller 128. The programmable current source 120 is one embodiment of the programmable current source 100 depicted in FIG. 2. Thus, the current source 122 and controller 128 correspond to the current source(s) 102 and controller(s) 104, respectively, depicted in FIG. 2. Referring back to FIG. 3A, the current source 122 includes P-channel resistors 124 and 126, as well as the output 127. The output 127 provides the current $I_{120}$ as the output. The current source 122 is a current mirror.

The controller includes a resistor R1, which is a magnetic element 130. The magnetic element 130 is preferably a MTJ stack. However, in an alternate embodiment, the magnetic element 130 may be another structure. The magnetic element 130 is preferably the same as the magnetic elements (not shown) that are being programmed using the programmable current source 120. The magnetic element 130 can be written using the line 132. The output current $I_{120}$ of the current source 122 is controlled by the current flowing through the magnetic element 130 of the controller 128.

The resistance of the magnetic element 130 and the parameters of the transistors 124 and 126 determine the amplitude of the output current $I_{120}$ provided by the current source 122. If the channel widths and lengths of the two transistors 124 and 126 are the same, the source current of the two transistors would be the same. The value of the output current $I_{120}$ is given by $$I_{120}=(V_{dd}-V_{dg})/R_1$$

Where:

$V_{dd}$=the voltage drop between the drain and the ground of the transistors $V_{dg}$=the voltage drop between the drain and the gate of the transistors.

$R_1$=resistance of the magnetic element 130

In the programmable current source 120, the resistance, $R_1$, of the magnetic element 130 can be changed using a write current driven through the line 132. A change in the resistance of the magnetic element 130 can, therefore, change the amplitude of the output current $I_{120}$. Assuming that the magnetic element 130 is a MTJ stack, such as the MTJ stack 30 of FIG. 1, the resistance $R_1$ can be changed by approximately thirty percent (between the low resistance and high resistance states of the MTJ stack). In such an embodiment, the controller 128 can provide a thirty percent adjustment in the output current $I_{120}$.

Thus, through the resistance of the magnetic element 130, the controller 128 can control the current source 122 to provide a varying, programmable current. The current used to program the magnetic elements that store data can be controlled based at least in part upon the resistance of the magnetic element 130. The magnetic element 130 in the controller 128 can also be used to ensure that the current provided by the programmable current source 120 takes into account variations in processing methods and tools as well as variations in the wafer, particularly if the programmable current source 120 is used for sections of the magnetic memory.

Figure 3B:
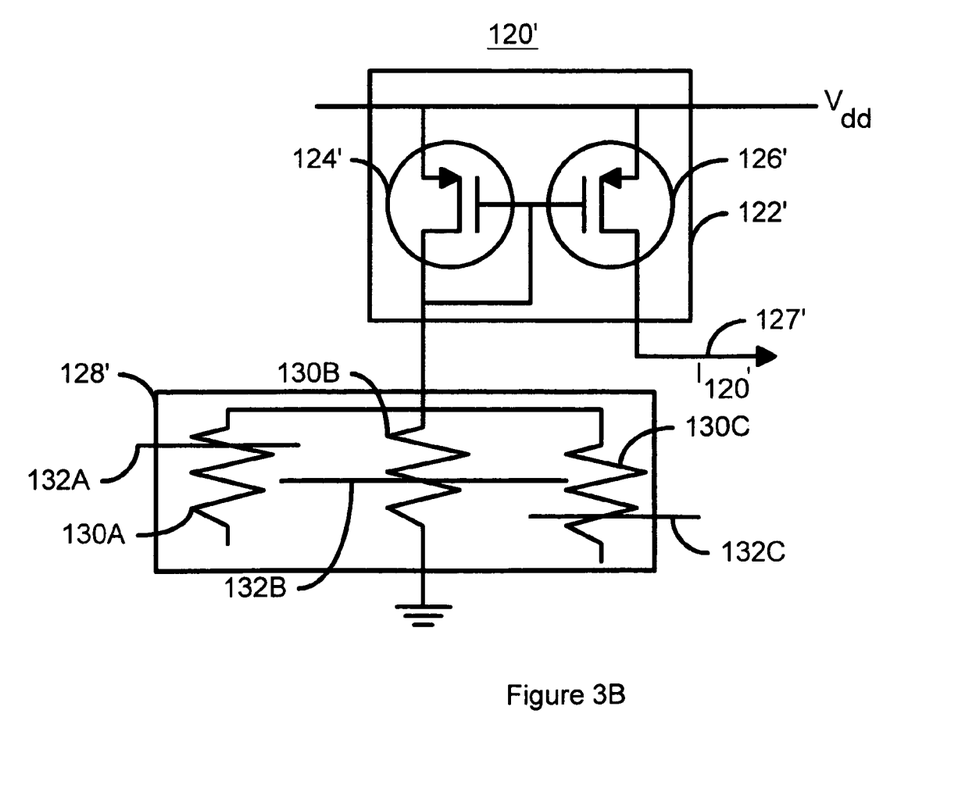
FIG. 3B is a more detailed diagram of a second version of the first embodiment of a programmable current source in accordance with the present invention.

FIG. 3B depicts a more detailed diagram of a second version 120' of the first embodiment of a programmable current source in accordance with the present invention. The programmable current source 120' includes substantially the same components as the programmable current source 120 depicted in FIG. 3A. Referring to FIGS. 3A and 3B, analogous components of the programmable current source 120' are labeled in a similar manner to the components of the programmable current source 120. The programmable current source 120' is thus used in programming magnetic elements within the magnetic memory cells. In a preferred embodiment, the programmable current source 120' is used in programming MTJ stacks, such as the MTJ stack 30 depicted in FIG. 1. Referring to FIGS. 1 and 3B, for example, the programmable current source 120' might be used in providing $I_1$ and/or $I_2$, discussed above. Also in a preferred embodiment, the programmable current source 120' provides a current to a portion of the magnetic elements in the magnetic memory. For example, the magnetic memory might be divided into an array of partitions, each of which corresponds to and is written by a particular programmable current source 120'.

The programmable current source 120' includes a current source 122' and a controller 128'. The current source 122' is analogous to the current source 122 and thus contains substantially the same components. Although the controller 128' correspond to the controller 128, the controller 128' has multiple magnetic elements 130A, 130B, and 130C coupled in parallel. The magnetic elements 130A, 130B, and 130C have resistances $R_1'$, $R_1''$, and $R_1'''$, respectively. Although three magnetic elements 130A, 130B, and 130C are shown, another number of magnetic elements might be used. The magnetic elements 130A, 130B, and 130C are controller using the write lines 132A, 132B, and 132C, respectively.

Referring to FIGS. 3A and 3B, in the magnetic element 130 has a resistance $R_1$ that is stable at either a low value or a high value. Therefore, the controller 128 adjusts the amplitude of the output current $I_{120}$ in a binary manner. In the programmable current source 120' of FIG. 3B, the single magnetic element 130 of the programmable current source 120 has been replaced with multiple magnetic elements 130A, 130B, and 130C. The use of multiple magnetic elements 130A, 130B, and 130C having multiple write lines 132A, 132B, and 132C for programming allows for an increase in the resolution of the change in $I_{120}'$. The magnetic elements 130A, 130B, and 130C have resistances of $R_1'$, $R_1''$, and $R_1'''$, respectively.

The current flowing through the controller 128' and, therefore, the current output by the current source 122' depends upon the combination of resistances of the magnetic elements 130A, 130B, and 130C. Assuming each of the resistances $R_1'$, $R_1''$, and $R_1'''$ has a minimum value or $R_0$ and a maximum value of $R_0+\Delta R_0$, the total effective resistance of the combination of magnetic elements 130A, 130B, and 130C can take on four different values depending upon the state of each of the magnetic elements 130A, 130B, and 130C. The possible values of the total resistance are: $R_0/3$, $R_0(R_0+\Delta R_0)/(3R_0+2\Delta R_0)$, $R_0(R_0+\Delta R_0)/(3R_0+\Delta R_0)$, and $(R_0+\Delta R_0)/3$. Therefore, the programmable current source 120' can provide a current $I_{120}'$ having four different values. For transistors 124' and 126' that are the same, the four values of the current are given by $$I_{120}'=(V_{dd}-V_{dg})/R_i,$$

where Ri can take on one of the four values described above.

The programmable current source 120' thus has substantially the same benefits as the programmable current source 120. In addition, the programmable current source 120' provides an output current that can take on a number of values. The granularity with which the output current $I_{120}'$ can be controlled depends upon the number of magnetic elements, such as the magnetic elements 130A, 130B, and 130C. The larger the number of magnetic elements, the finer the control over the current that is provided by the programmable current source 120'. Note that although the magnetic elements 130A, 130B, and 130C are depicted as being coupled in parallel, nothing prevents another arrangement of the magnetic elements 130A, 130B, and 130C that would provide finer control over programming of the output current $I_{120}'$.

Figure 3C:
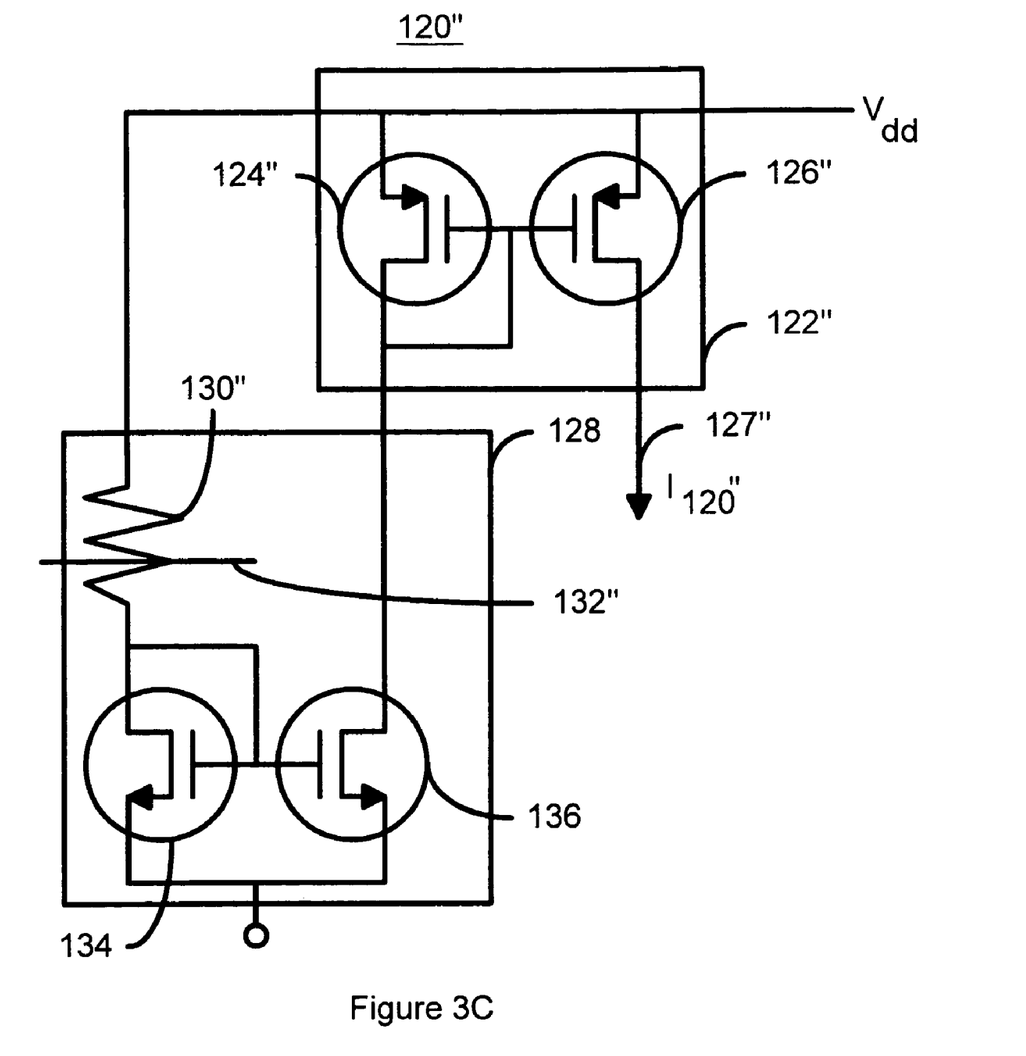
FIG. 3C is a more detailed diagram of a third version of the first embodiment of a programmable current source in accordance with the present invention.

FIG. 3C depicts a more detailed diagram of a third version 120" of the first embodiment of a programmable current source in accordance with the present invention. The programmable current source 120' includes some of the same components as the programmable current source 120 depicted in FIG. 3A. Referring to FIGS. 3A and 3C, analogous components of the programmable current source 120" are labeled in a similar manner to the components of the programmable current source 120. The programmable current source 120" is thus used in programming magnetic elements within the magnetic memory cells. In a preferred embodiment, the programmable current source 120" is used in programming MTJ stacks, such as the MTJ stack 30 depicted in FIG. 1. Referring to FIGS. 1 and 3C, for example, the programmable current source 120" might be used in providing $I_1$ and/or $I_2$, discussed above. Also in a preferred embodiment, the programmable current source 120" provides a current to a portion of the magnetic elements in the magnetic memory. For example, the magnetic memory might be divided into an array of partitions, each of which corresponds to and is written by a particular programmable current source 120".

The programmable current source 120" includes a current source 122" and a controller 128". The current source 122" is analogous to the current source 122 and thus contains substantially the same components. The current source 122" is thus a current mirror. Although the controller 128" correspond to the controller 128, additional elements are included. The controller 128" includes a magnetic element 130", which has a corresponding write line 132", and N-channel transistors 134 and 136. The magnetic element 130" is preferably a MTJ stack. However, the magnetic element 130" could include other structures, such as a GMR or AMR structure. The resistance of the magnetic element 130" is $R_2$. In a preferred embodiment, the magnetic element 130" has two stable states corresponding to two stable resistances.

The source current of the transistor 122''' is equivalent to the drain current of the transistor 136. The drain current of the transistor 124" is equal to:

$$I_{D126}=I_{124''}*W_{126''}*L_{124''}/(W_{124''}*L_{126''})$$

Where:
- $I_{126"}$ is the drain current of 126"
- $I_{124"}$ is the drain current of 124"
- $W_{126"}$ the channel width of 126"
- $W_{124"}$ the channel width of 124"
- $L_{126"}$ the channel length of 126"
- $L_{124"}$ the channel length of 124'

The drain current of transistor 136 can be varied by changing the resistance of the magnetic element 130". A change in the drain current of the transistor 136 results in a change in the current provided to the current source 122" and, therefore, a change in the output current, $I_{120"}$. The resistance of the magnetic element 130" is changed by programming the magnetic element 130" using write line 132". Thus, the output current source can be programmed by programming the magnetic element 130".

In a similar manner to the programmable current source 120 depicted in FIG. 3A, the programmable current source 120" can provide an output current having one of two amplitudes. The range of variation in the value of the output current $I_{120"}$ is determined by the range of variation in the resistance $R_2$. To increase the resolution of the change in $I_{120"}$, the magnetic element 130" can be an array of magnetic elements each of which preferably has a corresponding write line, in a similar manner to the programmable current source 120' depicted in FIG. 3B. Referring back to FIG. 3C, if an array of magnetic elements is used in lieu of the magnetic element 130", the magnetic elements could be coupled in parallel. Alternatively, the magnetic elements could be connected in series or a combination of series and parallel connection. The programmable current source 120" thus has substantially the same benefits as the programmable current source 120.

Figure 4A:
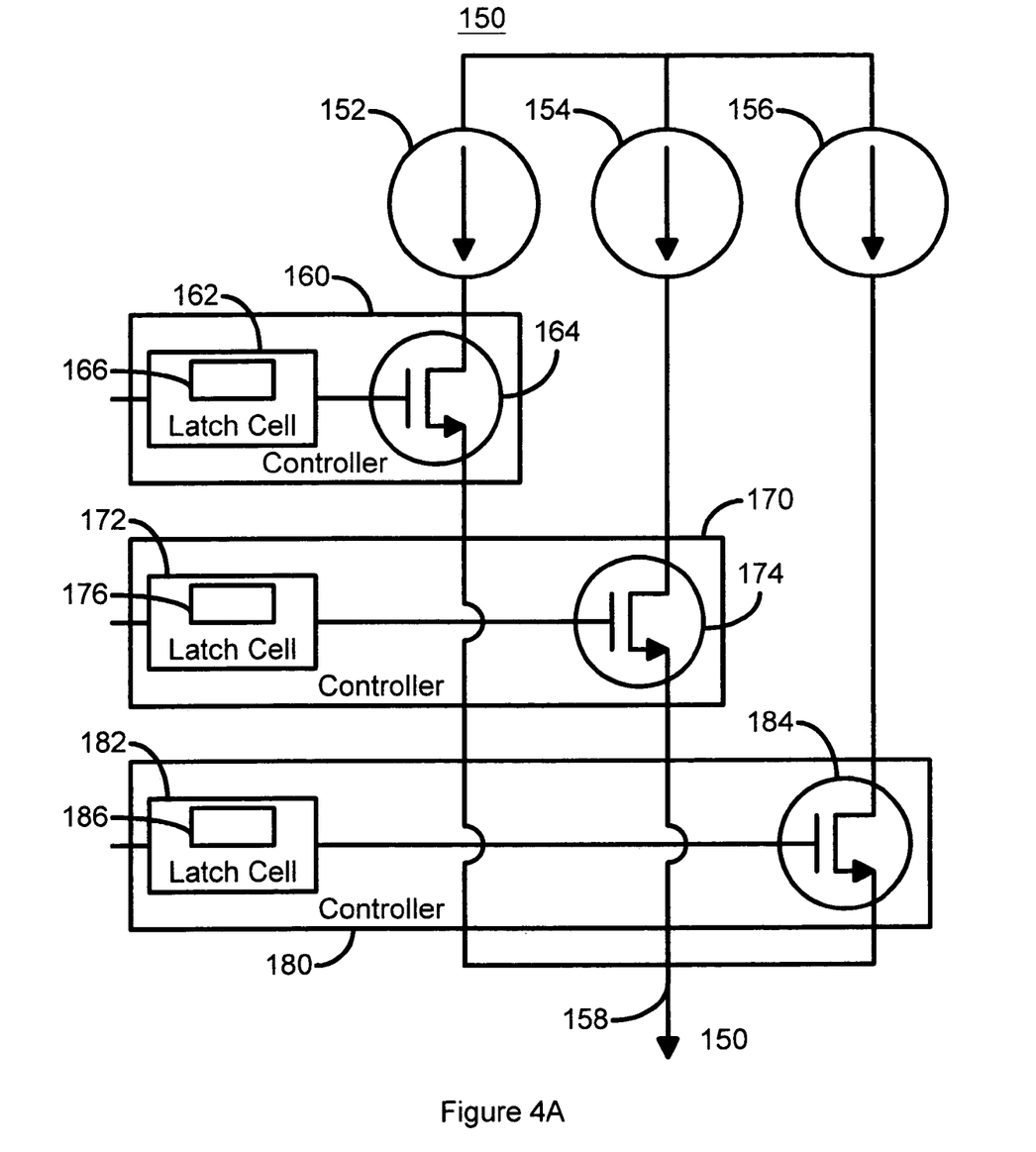
FIG. 4A is a more detailed diagram of a second embodiment of programmable current source in accordance with the present invention.

FIG. 4A depicts a more detailed diagram of a second embodiment 150 of programmable current source in accordance with the present invention. The programmable current source 150 includes multiple current sources 152, 154, and 156 as well as multiple controllers 160, 170, and 180. In the embodiment shown, each current source 152, 154, and 156 is controlled by a separate, dedicated controller 160, 170, and 180, respectively. In such an embodiment, each current source and controller combination 152 and 160, 154 and 170, 156 and 180, could be considered a separate, independent programmable current source within the programmable current source 150. However, in an alternate embodiment, the controller 160, 170, and 180 may control more than one current source. In addition, although three current sources 152, 154, and 156 and three controllers 160, 170, and 180 are shown, nothing prevents the programmable current source 150 from having another number of current sources and/or controllers. The current sources 152, 154, and 156 preferably correspond and have a structure analogous to the current source 102, 122, 122', and 122". However, nothing prevents the current sources 152, 154, and 156 from having another structure. Furthermore, nothing requires that the current sources 152, 154, and 156 provide the same current. Instead, the current sources 152, 154, and 156 could provide different currents. The controllers 160, 170, and 180 preferably correspond to the controllers 104, 128, 128', and 128". However, as discussed below, the structure of the controllers 160, 170, and 180 preferably differs.

The controllers 160, 170, and 180 each includes a latch cell 162, 172, and 182, respectively, and a transistor 164, 174, and 184, respectively. One embodiment of the latch cells 162, 172, and 182 is described below. The transistors 164, 174, and 184 are turned on or off by the latch cells 162, 172, and 182, respectively. The latch cells 162, 172, and 182 each includes one or more magnetic elements 166, 176, and 186, respectively. The magnetic elements 166, 176, and 186 are used to determine whether the latch cell 162, 172, and 182, respectively, turn on the transistors 162, 174, and 184. The transistors 164, 174, and 184 are controlled by the latch cells 162, 172, and 182 based upon the properties of the magnetic elements 166, 176, and 186, respectively.

The total output current of the programmable current source 150, $I_{150}$, is provided via the output 158. This output current is used to program some portion of the cells of the magnetic memory. The current sources 152, 154, and 156 are coupled in parallel through transistors 164, 174, and 184, respectively. Thus, based upon the latch cells 162, 172, and 182, the transistors 164, 174, and 184, respectively, are selectively coupled to the output 158. As discussed below, the output of the latch cell 162, 172, or 182 depends upon the state of the magnetic element 166, 176, or 186, respectively, within the latch cell 162, 172, or 182, respectively. Based upon whether the magnetic element 166, 176, or 186 is in a high or low resistance state, the output of the corresponding latch cell 162, 172, or 182, respectively, is high or low. If the output of a latch cell 162, 172, or 182 is a logic high, the associated transistor 164, 174, or 184, respectively, is turned on. When a transistor 164, 174, or 184 is turned on, the associated current source 152, 154 or 156, respectively, contributes to the value of $I_{150}$. Thus, the transistors 164, 174 and 184 effectively function as switches for the current sources 152, 154, and 156, respectively. Therefore, the amplitude of $I_{150}$ is adjusted by programming the magnetic elements 166, 176, and 186 in the latch cells 162, 172, and 182, respectively, to change the output of the latches to turn on or off the transistors 164, 174, and 184.

Thus, using the programmable current source 150, a varying, programmable current can be used in programming magnetic elements (not shown) in memory cells (not shown). The magnetic elements 166, 176, and 186 in the controllers 160, 170, and 180, respectively, can also be used to ensure that the current provided by the programmable current source 150 takes into account variations in processing methods and tools as well as variations in the wafer, particularly if the programmable current source 150 is used for sections of the magnetic memory. In addition, the programmable current source 150 provides an output current that can take on a number of values. The granularity with which the output current $I_{150}$ can be controlled depends upon the number of current sources 152, 154, and 156 and the number of controllers 160, 170, and 180, respectively. The larger the number of combinations of current sources 152, 154, and 156 and controllers 160, 170, and 180, respectively, the finer the control over the current that is provided by the programmable current source 150.

Figure 4B:
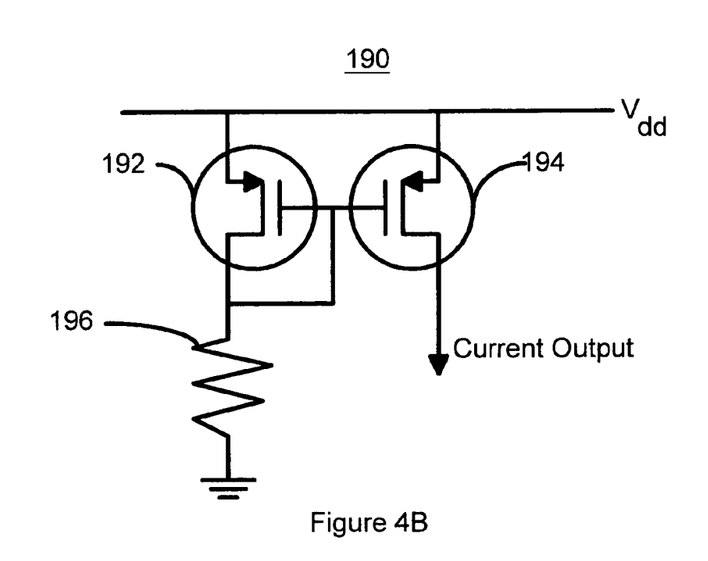
FIG. 4B is a more detailed diagram of one embodiment of the current source utilized in the second embodiment of the programmable current source in accordance with present invention.

FIG. 4B depicts a more detailed diagram of one embodiment of a current source 190 utilized in the second embodiment of the programmable current source in accordance with present invention. The current source 190 is preferably used for the current sources 152, 154, and 156 depicted in FIG. 4A. However, nothing prevents the use of another current source. Referring to FIGS. 4A and 4B, the current source 190 includes a current mirror having P-channel transistors 192 and 194. The current source 190 also includes a resistor 196. However, the resistor 196 is preferably not a magnetic element. Consequently, the output of the current source 190, and thus the current sources 152, 154, and 156, is preferably not separately programmed. Instead, a relatively constant output based upon the resistance of the resistor 196 is provided. The programming of the programmable current source 150 is due instead to selectively coupling the current sources 152, 154, and 156 to the output 158 of the programmable current source 150.

Figure 4C:
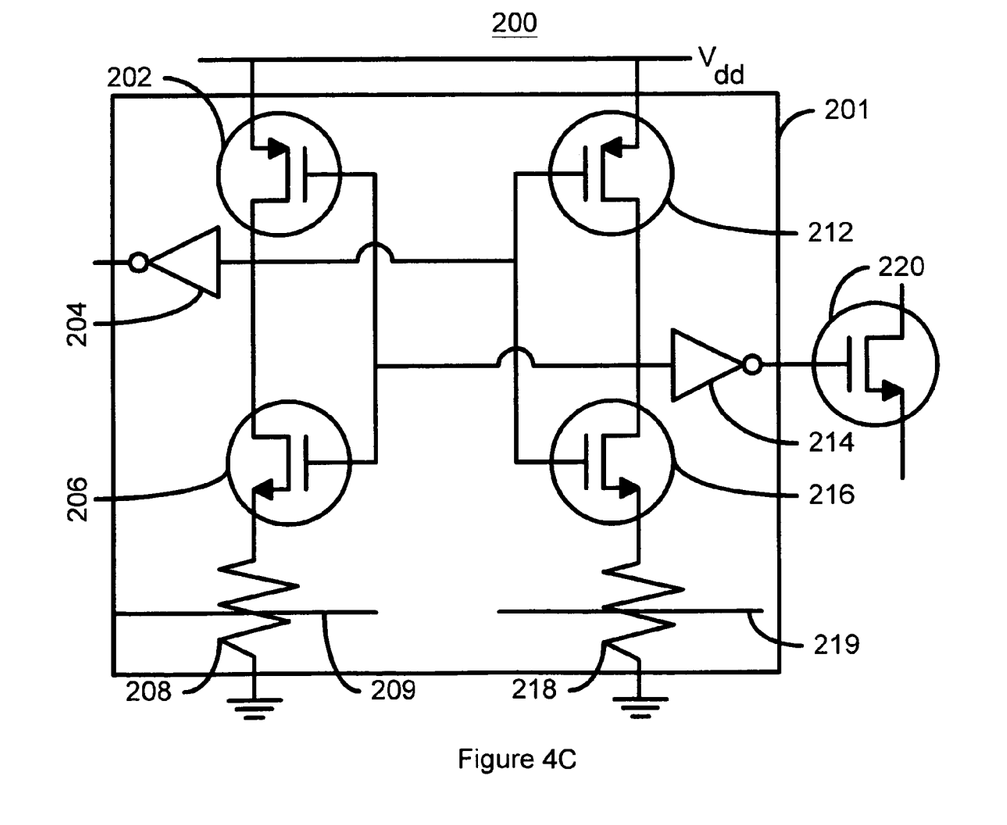
FIG. 4C is a more detailed diagram of a portion of one embodiment of a controller for the second embodiment of the programmable current source in accordance with present invention.

FIG. 4C depicts a more detailed diagram of a portion of a controller 200 for the second embodiment of the programmable current source in accordance with present invention. The controller 200 is preferably used for the controllers 160, 170, and 180 depicted in FIG. 4A. Referring to FIGS. 4A and 4C, the controller 200 includes a latch cell 201 and a transistor 220. The latch cell 201 is preferably used for each of the latch cells 162, 172, and 182. The transistor 220 is preferably used for each of the transistors 164, 174, and 184. The transistor 220 is preferably a MOS transistor.

The latch cell 201 includes P-channel transistors 202 and 212, inverters 204 and 214, N-channel transistors 206 and 216, and magnetic elements 208 and 218, depicted as resistors, having write lines 209 and 219, respectively. The magnetic elements 208 and 218 preferably correspond to the magnetic elements 166, 176, and 186. Thus, each latch cell 162, 172, and 182 preferably includes two magnetic elements. The magnetic elements 208 and 218 are substantially the same as the magnetic elements (not shown) that are to be programmed. In a preferred embodiment, the magnetic elements 208 and 218 are MTJ stacks, such as the MTJ stack 30. However, nothing prevents the use of another magnetic element, such as a GMR or AMR magnetic element. The output of the latch cell 201 can be provided through the inverter 204 and 214. In the embodiment shown, the inverter 214 is used to provide an output to the transistor 220. The output is either a high or a low logic value. Thus, the latch cell 201 can be used to drive the gate of the transistor 220.

Consequently, when used for the controllers 160, 170, and 180, the controller 200 can drive the transistor 220 (and thus the transistors 164, 174, and 184) to selectively connect (or disconnect) a particular current source 152, 154, and 156 to the output 158. Each current source 152, 154, and 156, therefore, selectively contributes to the output current, $I_{150}$. Thus, the current sources 152, 154, and 156 can be used to adjust the total amplitude of the current to turn on or off a particular current leg to adjust the total amplitude of a current driver. The output of the latch cell 201 is maintained even in the event that power to the controller 200 is turned off. If the magnetic element 218 is programmed to have a higher resistance than the magnetic element 208, the inverter 204 has a logic "high" out put while the inverter 214 has a logic "low" output when the power is turned on. Otherwise if the magnetic element 218 is programmed to have a resistance that is smaller than the magnetic element 208, the outputs of the inverters 204 and 214 are reversed. Using the controller, therefore, the output current, $I_{150}$, can be programmed.

Figure 4D:
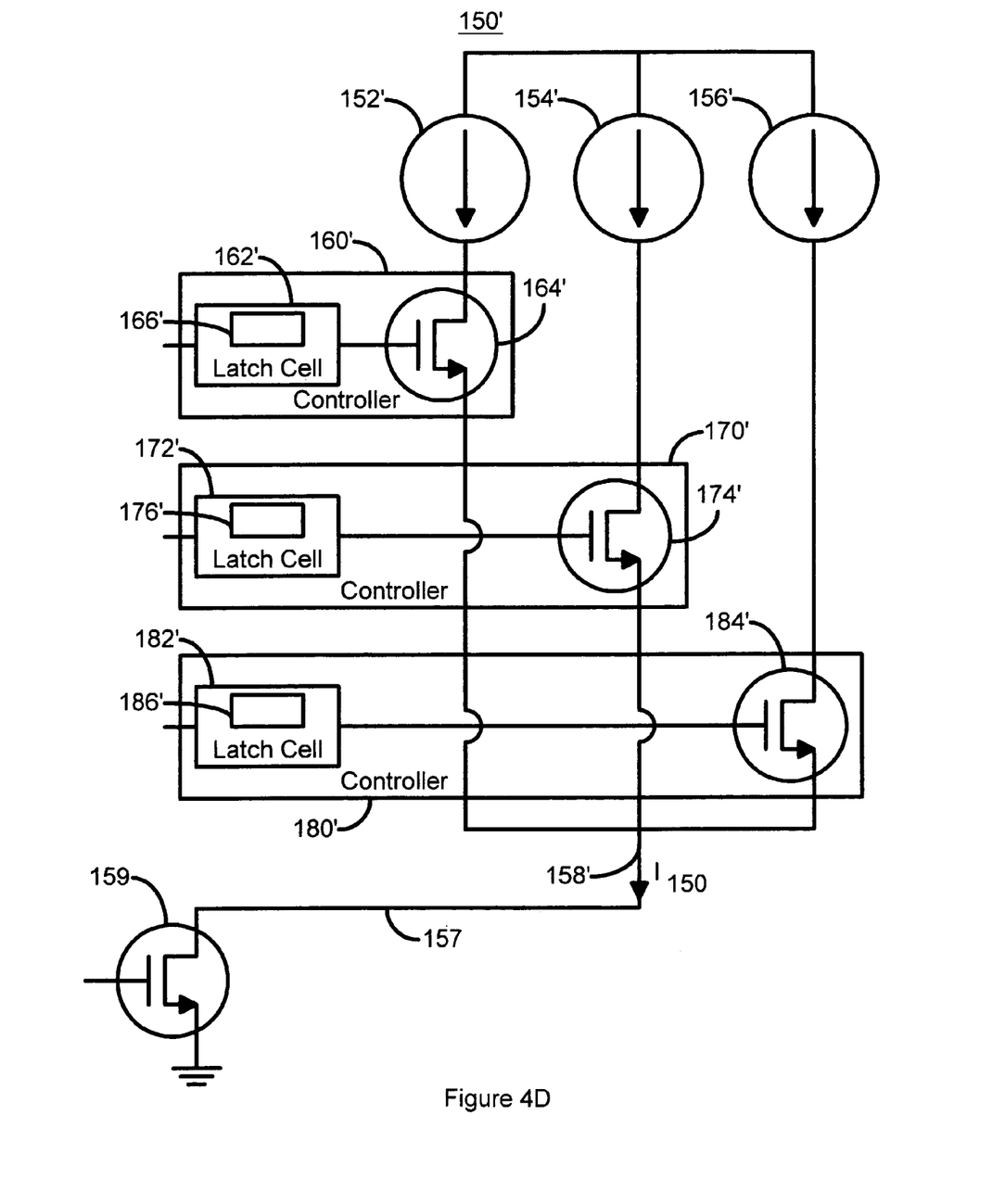
FIG. 4D is a more detailed diagram of a second version of the second embodiment of programmable current source in accordance with the present invention.

FIG. 4D depicts a more detailed diagram of a second version 150' of the second embodiment of programmable current source in accordance with the present invention. The programmable current source 150' corresponds to the current source 150 depicted in FIG. 4A and thus has many components that are analogous. Referring to FIGS. 4A and 4D, analogous components are labeled similarly. Consequently, the programmable current source 150' includes controllers 160', 170', and 180' having latch cells 162', 172' and 182', respectively, and transistors 164', 174', and 184', respectively. In a preferred embodiment, the controller 200 depicted in FIG. 4C is used for the controllers 160', 170', and 180'. Consequently, the transistors 164', 174', and 184' are controlled using magnetic element(s) 166', 176', and 186', respectively, to selectively couple the current sources 152', 154', and 156' to the output 158'. Thus, the transistors 164', 174' and 184' effectively function as switches for the current sources 152', 154', and 156', respectively. The current sources 152', 154', and 156' correspond to the current sources 152, 154, and 156, respectively. Thus, the current source 190 depicted in FIG. 4B is preferably used for each of the current sources 152', 154', and 156'. In addition, the controller 200 of FIG. 4C is preferably used for the controllers 160', 170', and 180'. Also depicted in FIG. 4D are data programming line 157 and transistor 159.

In the programmable current source 150', the output 158' is coupled to a data programming line 157. At the opposing end of the line 157, the transistor 159 is preferably coupled to ground. Some portion of the magnetic elements (not shown) of the memory residing between the transistors 164', 174', and 184' and the transistor 159 may be programmed using the programmable current source 150'. The transistor 159 acts as a switch. The size of the transistor 159 should be sufficient to accommodate the sum of the output currents, $I_1'$, $I_2'$, and $I_3'$ of the current sources 152', 154', and 156'. The programmable current source 150' has substantially the same benefits of the current source 150. In addition, the transistor 159 allows the programmable current source 150' to be decoupled.

Figure 5:
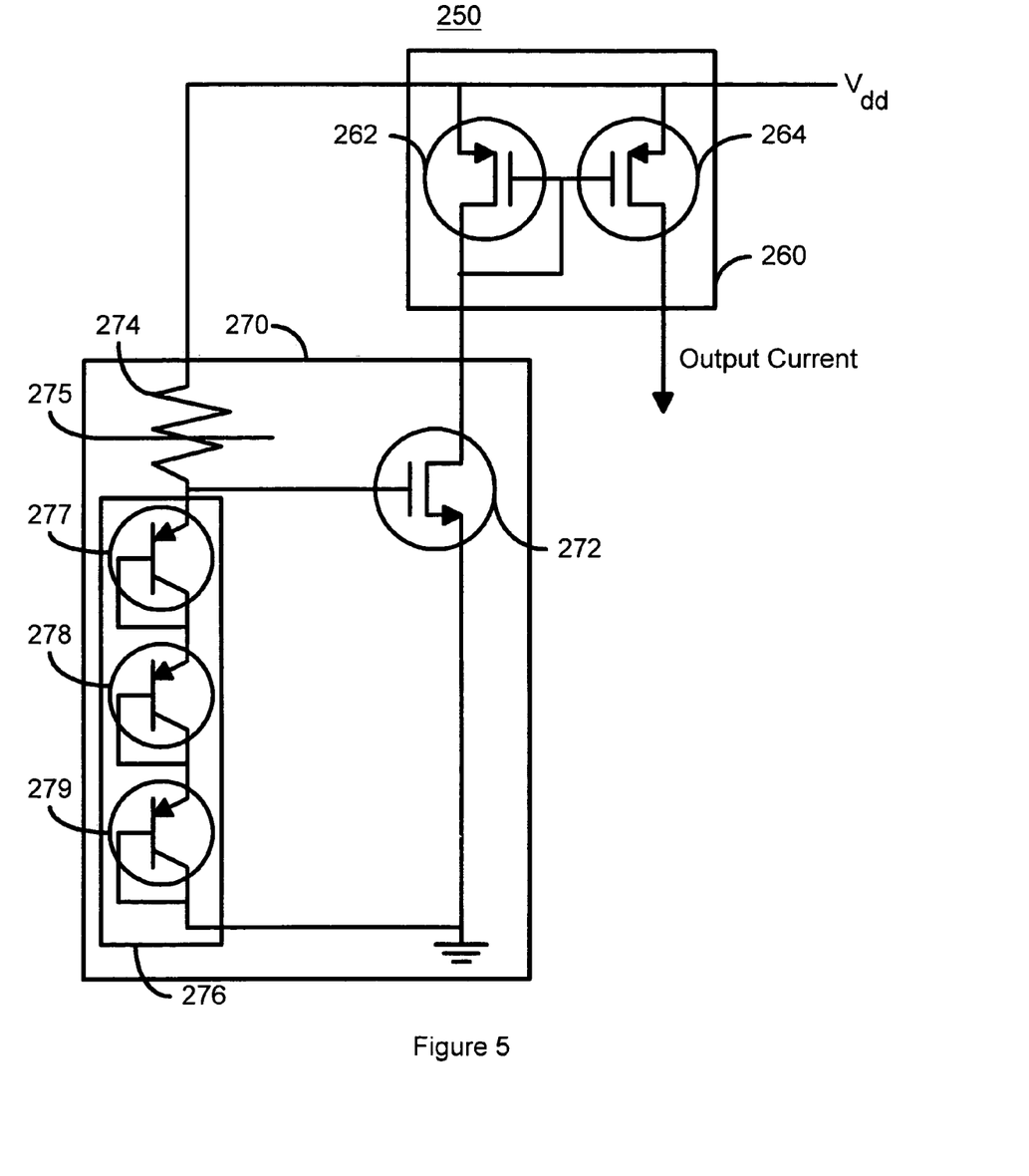
FIG. 5 is a more detailed diagram of a third embodiment of a programmable current source in accordance with present invention that provides a temperature dependent current.

FIG. 5 depicts a more detailed diagram of a third embodiment of a programmable current source 250 in accordance with present invention that provides a programmable and temperature dependent current. The programmable current source 250 is thus used in programming magnetic elements within the magnetic memory cells. In a preferred embodiment, the programmable current source 250 is used in programming MTJ stacks, such as the MTJ stack 30 depicted in FIG. 1. Referring to FIGS. 1 and 5, for example, the programmable current source 250 might be used in providing $I_1$ and/or $I_2$, discussed above. Also in a preferred embodiment, the programmable current source 250 provides a current to a portion of the magnetic elements in the magnetic memory. For example, the magnetic memory might be divided into an array of partitions, each of which corresponds to and is written by a particular programmable current source 250. Referring to FIGS. 2 and 5, the programmable current source 250 includes a current source 260 and a controller 270. The current source 260 corresponds to the current source 102, while the controller 270 corresponds to the controller 104.

The current source 260 is preferably a current mirror having P-channel transistors 262 and 264. The output current $I_{250}$ provided by the current source 260, and thus the programmable current source 250, is controller by the current input to the current mirror by the controller 270. Consequently, the current source 250 functions in an analogous manner to the current source 122 depicted in FIG. 3A.

Referring back to FIG. 5, the controller 270 includes at least one magnetic element 274, depicted as a resistor, and an N-channel transistor 272. The magnetic element 274 is preferably a MTJ stack having a programming line 275. In this aspect, the programmable current source 250 functions in a similar manner to the programmable current source 120 depicted in FIG. 3A. Referring back to FIG. 5, the output current amplitude can thus be programmed by supplying a current having the proper magnitude and direction to the programming line 275 to change the resistance value of the magnetic element 274. Thus, by programming the magnetic element 274, the output current $I_{250}$ can be programmed.

The controller 270 also includes a temperature sensor 276. In a preferred embodiment, the temperature sensor 276 includes transistors 277, 278, and 279, which are preferably diode connected bi-polar transistors. However, in an alternate embodiment, another temperature sensor could be used. In addition, fewer or more transistors 277, 278, and 279 can be used so that the output current of the programmable current source 250 adjusts the room-temperature bias in order to meet design requirements. The pn-junction transistors 277, 278, and 279 can also be connected in series with resistors to adjust the temperature sensitivity of the output current to match the temperature sensitivity of the required write current of the MRAM cells (not shown).

The transistors 277, 278, and 279 in combination with the transistor 272 allow the output current to chance as a function of temperature. The diode connected transistors 277, 278, and 279 provide the function of temperature sensing in the present invention and can be replaced by diodes. In general, the voltage drop across a forward biased pn-junction in silicon depends on temperature with a gradient of approximately −2 mV/K. The transistors 277, 278, and 279 having this temperature coefficient are preferably used for an on-chip temperature measurement. The forward bias of a pn-junction is about 0.7 V. If the temperature changes by one hundred degrees centigrade, the percentage change of the forward bias is −200/700 or about twenty-eight percent, a significant change. Easily accessible pn-junctions are found in several semiconductor devices, such as bipolar transistors in BiCMOS technologies or in lateral and vertical bipolar devices in standard CMOS technologies. In case of bipolar technology, either an NPN or a PNP transistor connected as a diode can be utilized for each of the transistors 277, 278, and 279. In case of CMOS technology, a substrate PNP or a substrate NPN should be utilized for n-well and p-well CMOS technologies, respectively. For the n-well technology, which is the preferred CMOS technology, the PNP transistor is formed by P+ diffusion inside the n-well and the p-type substrate. The P+ diffusion forms the emitter, the n-well forms the base and the p-type substrate forms the collector.

The gate of the N-channel transistor 272 is biased by the forward voltage drop across the three emitter-base pn-junction transistors 277, 278, and 279. When the temperature of the magnetic memory for which the programmable current source 250 is used increases, the forward voltage drop across the transistors 277, 278, and 279 decreases. As a consequence, the gate-source voltage drops for the transistor 272. Consequently, the source current of the transistor 272 decreases. Because of the use of a current mirror for the current source 260, the output current $I_{250}$ decreases, achieving the objective of decreasing the write current of the MRAM cells when the chip temperature rises. Note that a temperature sensor 276 could have a positive temperature coefficient where appropriate.

Thus, through the resistance of the magnetic element 274, the controller 270 can control the current source 260 to provide a varying, programmable current. Thus, the advantages of the current source 120 can be obtained. In addition, if multiple magnetic elements are used in lieu of the magnetic element 274, finer control over the programming of the current can be obtained. Furthermore, the programmable current source 250 integrates programming of the current with temperature sensitivity. In particular, the amplitude of output current decreases with increases in temperature. As discussed above, the switching current required to write to a magnetic element decreases with increasing temperature. Further, the temperature dependency of the write current increases when the size of the magnetic element decreases. Consequently, as memories become denser and use smaller magnetic elements, the changes in switching current with temperature become more dramatic. Consequently, the magnetic memory may malfunction without adjustments in the write current based upon temperature. The programmable current source 250 allows the temperature to be automatically taken into account. A write current that is programmable and adequate for the temperature of the magnetic memory may be provided using the programmable current source 250. Consequently, performance of the magnetic memory using the programmable current source 250 may be improved.

Figure 6:
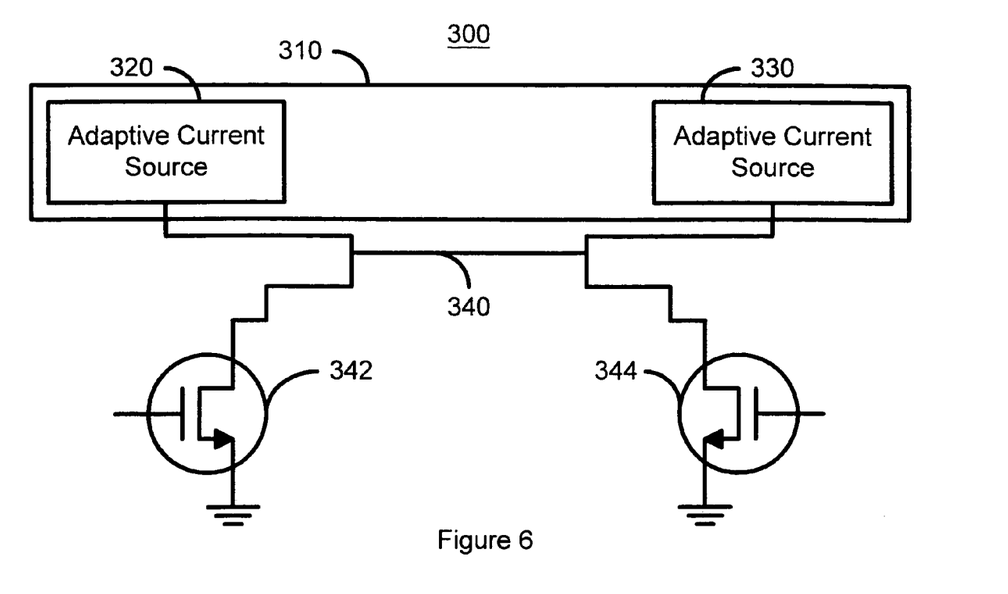
FIG. 6 depicts one embodiment of a portion of a magnetic memory employing a fourth embodiment of a programmable current source in accordance with present invention.

FIG. 6 depicts one embodiment of a portion of a magnetic memory 300 employing a fourth embodiment of a programmable current source in accordance with present invention. The magnetic memory 300 utilizes a programmable current source 310 for programming at least a portion of the magnetic memory cells (not explicitly shown). The programmable current source 310 includes adaptive current sources 320 and 330. The adaptive current sources 320 and 330 are preferably formed using one or more of the programmable current sources 100, 120, 120', 150, 150' and/or 250. The Thus, each of the adaptive current sources 320 and 330 includes at least one controller (not explicitly shown) that controls current based upon a magnetic element and at least one current source. Moreover, the adaptive current sources 320 and 330 preferably include independent controllers (not explicitly shown) and are thus independent.

The programmable current source 310 is coupled to a write line 340, which provides the current for programming magnetic elements (not shown) in a portion of the magnetic memory cells (not shown) of the magnetic memory 300. The write line 340 is coupled with switches 342 and 344. The programmable current source 310 is coupled to the write line 340 such that the adaptive current source 320 provides a current to the write line 340 which can travel through the switch 344. Similarly, the programmable current source 310 is coupled to the write line 340 such that the adaptive current source 330 provides a current to the write line 340 which can travel through the switch 342. In general, to write an MRAM cell from one content (e.g. a logical "0" or logical "1") to the other content (e.g. a logical "1" or logical "0", respectively), the bit line current used is bi-directional. In particular, programming a "0" uses a current in a direction opposite to that used for programming a "1". In addition, the amplitude of the two currents required to write to the magnetic elements (not shown) can be different, depending on the property of the magnetic elements (not shown) being programmed. The use of two independent adaptive current sources 320 and 330 matched with two independent current switches 344 and 342, respectively, can be used to independently provide and optimize the two currents of different directions. Thus, when the adaptive current source 320 is used to provide the current, the transistor 344 is turned on and current flows from left to right as shown in FIG. 6. When the adaptive current source 330 is used, the transistor 342 is closed and current flows from right to left as shown in FIG. 6.

Using the programmable current source 310, essentially the same benefits can be achieved as for the programmable current sources 100, 120, 120', 150, 150', and 250. When the bi programmable current source 300 is used for a section of the memory 300, variations across a wafer can also be accounted for. Furthermore, currents in opposing directions can be provided using the programmable current source 300. Consequently, writing of a magnetic memory is facilitated and performance improved.

Figure 7:
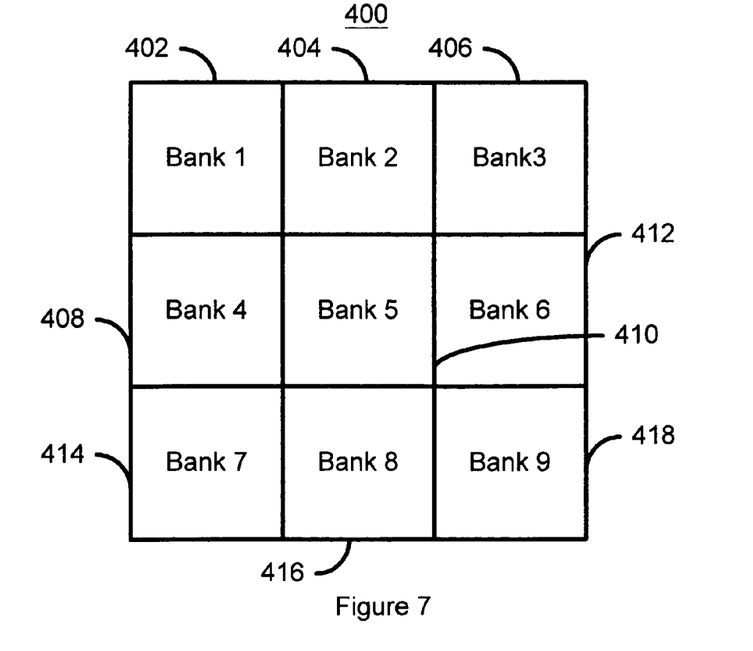
FIG. 7 depicts a high-level diagram of one embodiment of a memory employing a programmable current source in accordance with the present invention.

FIG. 7 depicts a high-level diagram of one embodiment of a memory 400 employing a programmable current source in accordance with the present invention. The magnetic memory 400 includes memory cells that have been partitioned into banks 402, 404, 406, 408, 410, 412, 414, 416, and 418. One of ordinary skill in the art will readily recognize that another number of banks could be employed. As discussed above, the programmable current sources 100, 120, 120', 150, 150', 250, and 300 can be used to program all or a portion of the cells in a magnetic memory. If the programmable current sources 100, 120, 120', 150, 150', 250, and 300 are used to program a portion of the cells in a magnetic memory, variations in the switching field of the magnetic cells across a wafer and from wafer to wafer can be accounted for in the first order. The switching field variation of the memory cells across a die or wafer can be addressed using the banks 402, 404, 406, 408, 410, 412, 414, 416, and 418. Each bank 402, 404, 406, 408, 410, 412, 414, 416, and 418 has its own programmable current source and sinks. One bank 402, 404, 406, 408, 410, 412, 414, 416, or 418 may be different from another bank 402, 404, 406, 408, 410, 412, 414, 416, and 418 in terms of programming current requirements, for example due to the variation of device dimension, film thickness and film property. To address this issue, each bank 402, 404, 406, 408, 410, 412, 414, 416, and 418 can have a set of programmable current sources 100, 120, 120', 150, 150', 250, or 300 (not shown in FIG. 7) and sinks or transistor switches (not shown) discussed above for driving the bit lines and word lines. The number of banks 402, 404, 406, 408, 410, 412, 414, 416, and 418 into which the memory 400 is partitioned may depend upon a variety of factors including the uniformity of the wafer being used. Thus, as discussed above, nonuniformities across a particular wafer can be accounted for.

A method and system has been disclosed for providing programmable current sources that allow for improved performance of a magnetic memory. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory comprising:
a plurality of magnetic memory cells, each of the plurality of magnetic memory cells including a first magnetic element;
at least one programmable current source for programming a portion of the plurality of magnetic memory cells, each of the at least one programmable current source including a controller and a current source coupled to the controller, the controller including at least one second magnetic element, the at least one second magnetic element being substantially the same as the first magnetic element, the controller for determining a current provided by the current source based on the at least the second magnetic element, the at least one second magnetic element integrated into and not being programmed by the at least one programmable current source for data storage.

2. A magnetic memory comprising:
a plurality of magnetic memory cells, each of the plurality of magnetic memory cells including a first magnetic element;
at least one programmable current source for programming a portion of the plurality of magnetic memory cells, each of the at least one programmable current source including a controller and a current source coupled to the controller, the controller including at least one second magnetic element, the at least one second magnetic element being substantially the same as the first magnetic element, the controller for determining a current provided by the current source based on the at least the second magnetic element;
wherein the current source further includes a current mirror.

3. The magnetic memory of claim 2 wherein the controller further includes bias circuitry.

4. A magnetic memory comprising:
a plurality of magnetic memory cells, each of the plurality of magnetic memory cells including a first magnetic element;
at least one programmable current source for programming a portion of the plurality of magnetic memory cells, each of the at least one programmable current source including a controller and a current source coupled to the controller, the controller including at least one second magnetic element, the at least one second magnetic element being substantially the same as the first magnetic element, the controller for determining a current provided by the current source based on the at least the second magnetic element;
wherein the controller further includes a plurality of latch circuits including the at least the second magnetic element, the plurality of latch circuits for selectively driving the current source.

5. A magnetic memory comprising:
a plurality of magnetic memory cells, each of the plurality of magnetic memory cells including a first magnetic element;
at least one programmable current source for programming a portion of the plurality of magnetic memory cells, each of the at least one programmable current source including a controller and a current source coupled to the controller, the controller including at least one second magnetic element, the at least one second magnetic element being substantially the same as the first magnetic element, the controller for determining a current provided by the current source based on the at least the second magnetic element;
wherein the controller further includes a temperature sensor for allowing the current source to provide a temperature sensitive current.

6. A magnetic memory comprising:
a plurality of magnetic memory cells, each of the plurality of magnetic memory cells including a first magnetic element;
a first adaptive current source including a first programmable current source for programming a portion of the plurality of magnetic memory cells, the first programmable current source including a first controller and a first current source coupled to the first controller, the first controller for determining a first current provided by the first current source, the first controller including at least a second magnetic element, the at least the second magnetic element being substantially the same as the first magnetic element, the first controller controlling the first current provided by the first current source based on the at least the second magnetic element; and
a second adaptive current source including a second programmable current source for programming the portion of the plurality of magnetic memory cells, the second programmable current source including a second controller and a second current source coupled to the second controller, the second controller for determining a second current provided by the second current source, the second controller including at least a third magnetic element, the at least the third magnetic element being substantially the same as the first magnetic element, the second controller controlling the second current provided by the second current source based on the at least the third magnetic element.

7. The magnetic memory of claim 6 wherein the first current source further includes a current mirror.

8. The magnetic memory of claim 7 wherein the first controller further includes bias circuitry.

9. The magnetic memory of claim 6 wherein the second current source further includes a current mirror.

10. The magnetic memory of claim 8 wherein the second controller further includes bias circuitry.

11. The magnetic memory of claim 6 wherein the first controller further includes a plurality of latch circuits including the at least the second magnetic element, the plurality of latch circuits for selectively driving the first current source.

12. The magnetic memory of claim 6 wherein the second controller further includes a plurality of latch circuits including the at least the third magnetic element, the plurality of latch circuits for selectively driving the second current source.

13. The magnetic memory of claim 6 wherein the controller further includes a temperature sensor for allowing the current source to provide a temperature sensitive current.

14. A method for providing a magnetic memory comprising:
(a) providing a plurality of magnetic memory cells, each of the plurality of magnetic memory cells including a first magnetic element;
(b) providing at least one programmable current source for programming a portion of the plurality of magnetic memory cells, each of the at least one programmable current source including a controller and a current source coupled to the controller, the controller for determining a current provided by the current source, the controller including at least one second magnetic element, the at least one second magnetic element being substantially the same as the first magnetic element, the controller controlling the current provided by the current source based on the at least the second magnetic element, the at least one second magnetic element integrated into and not being programmed by the at least one programmable current source for data storage.

15. A method for providing magnetic memory comprising:
(a) providing a plurality of magnetic memory cells, each of the plurality of magnetic memory cells including a first magnetic element;
(b) providing a first adaptive current source including a first programmable current source for programming a portion of the plurality of magnetic memory cells, the first programmable current source including a first controller and a first current source coupled to the first controller, the first controller for determining a first current provided by the first current source, the first controller including at least a second magnetic element, the at least the second magnetic element being substantially the same as the first magnetic element, the first controller controlling the first current provided by the first current source based on the at least the second magnetic element; and
(c) providing a second adaptive current source including a second programmable current source for programming the portion of the plurality of magnetic memory cells, the second programmable current source including a second controller and a second current source coupled to the second controller, the second controller for determining a second current provided by the second current source, the second controller including at least a third magnetic element, the at least the third magnetic element being substantially the same as the first magnetic element, the second controller controlling the second current provided by the second current source based on the at least the third magnetic element.

16. A method for utilizing a magnetic memory including a plurality of magnetic memory cells, each of the plurality of magnetic memory cells including at least a first magnetic element, the method comprising:
programming at least a second magnetic element of at least one controller in at least programmable current source, the least one second magnetic element being substantially the same as the first magnetic element, the programmable current source for programming a portion of the plurality of magnetic memory cells, the at least one programmable current source also including at least one current source coupled to the at least one controller, the at least one second magnetic element integrated into and not being programmed by the at least one programmable current source for data storage;
using the at least one controller to control at least one current provided by the at least one current source based upon the at least the second magnetic element.

17. A method of programming magnetic memory including a plurality of magnetic memory cells, each of the plurality of magnetic memory cells including a first magnetic element, the method comprising:
programming at least a second magnetic element of at least a first adaptive current source, the first adaptive current source including a first programmable current source for programming a portion of the plurality of magnetic memory cells, the first programmable current source including a first controller and a first current source coupled to the first controller, the first controller for determining a first current provided by the first current source based on the at least the second magnetic element, the first controller including the at least the second magnetic element, the at least the second magnetic element being substantially the same as the first magnetic element; and
programming at least a third magnetic element of a second adaptive current source, the second adaptive current source including a second programmable current source for programming the portion of the plurality of magnetic memory cells, the second programmable current source including a second controller and a second current source coupled to the second controller, the second controller for determining a second current provided by the second current source based on the at least the third magnetic element, the second controller including the at least the third magnetic element, the at least the third magnetic element being substantially the same as the first magnetic element.

* * * * *